(12) United States Patent
Peeters et al.

(10) Patent No.: US 10,090,442 B2
(45) Date of Patent: Oct. 2, 2018

(54) WHITE LIGHT EMITTING MODULE

(71) Applicant: PHILIPS LIGHTING HOLDING B.V., Eindhoven (NL)

(72) Inventors: Martinus Petrus Joseph Peeters, Weert (NL); Esther De Beer, Waalre (NL); Dirk Jan Van Kaathoven, Eindhoven (NL); Wouter Oepts, Shanghai (CN); Herman Johannes Gertrudis Gielen, Roosendaal (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 0 days.

(21) Appl. No.: 14/390,439

(22) PCT Filed: Apr. 4, 2013

(86) PCT No.: PCT/IB2013/052681
§ 371 (c)(1),
(2) Date: Oct. 3, 2014

(87) PCT Pub. No.: WO2013/150470
PCT Pub. Date: Oct. 10, 2013

(65) Prior Publication Data
US 2015/0049459 A1  Feb. 19, 2015

Related U.S. Application Data

(60) Provisional application No. 61/621,046, filed on Apr. 6, 2012.

(30) Foreign Application Priority Data

Apr. 10, 2012 (EP) .................................. 12163539
Mar. 15, 2013 (EP) .................................. 13159589

(51) Int. Cl.
F21V 9/16       (2006.01)
H01L 33/50      (2010.01)
(Continued)

(52) U.S. Cl.
CPC .............. *H01L 33/504* (2013.01); *F21K 9/60* (2016.08); *F21K 9/64* (2016.08); *H01L 25/0753* (2013.01); *H01L 2924/0002* (2013.01)

(58) Field of Classification Search
CPC .......... F21Y 2113/002; F21Y 2113/005; F21Y 2113/007
(Continued)

(56) References Cited

U.S. PATENT DOCUMENTS

2005/0117334 A1   6/2005   Lee et al.
2005/0135094 A1   6/2005   Lee et al.
(Continued)

FOREIGN PATENT DOCUMENTS

CN    101583690 A    11/2009
DE    202011000007 U1   6/2012
(Continued)

OTHER PUBLICATIONS

Wu, J. et al. "Structure-property correlations in Ce-doped garnet phosphors for use in solid state lighting", Chemical Physics Letters, elsevier BV, NL, vol. 441, No. 4-6, Jun. 15, 2007, pp. 250-254.

*Primary Examiner* — Sean Gramling
(74) *Attorney, Agent, or Firm* — Akarsh P. Belagodu

(57) ABSTRACT

A light emitting module (10), adapted to produce white output light having an emission peak in the wavelength range from 400 to 440 nm, comprises: •—at least one first light emitting element (110) adapted to emit light having an emission peak in a first wavelength range from 440 to 460 nm; •—at least one wavelength converting material (85) arranged to receive light emitted by said first light emitting (Continued)

element, and being capable of emitting light having an emission peak in the green to red wavelength range; and
• —at least one second light emitting element (120) adapted to emit light having an emission peak in a second wavelength range from 400 to 440 nm. The module according to the invention provides white light of acceptable color rendering with a "crisp white" effect.

13 Claims, 10 Drawing Sheets

(51) Int. Cl.
    *H01L 25/075*    (2006.01)
    *F21K 9/60*      (2016.01)
    *F21K 9/64*      (2016.01)

(58) Field of Classification Search
    USPC .................................................. 362/84, 231
    See application file for complete search history.

(56) References Cited

U.S. PATENT DOCUMENTS

| | | |
|---|---|---|
| 2007/0284563 A1 | 12/2007 | Lee et al. |
| 2008/0023833 A1 | 1/2008 | Daubenspeek et al. |
| 2008/0297054 A1 | 12/2008 | Speier |
| 2009/0262515 A1* | 10/2009 | Lee .................... H01L 25/0753 362/84 |
| 2010/0244731 A1 | 9/2010 | Kaihotsu et al. |
| 2010/0245943 A1* | 9/2010 | Suyama ............... G02B 6/0038 358/475 |
| 2010/0328925 A1 | 12/2010 | Hoelen et al. |
| 2011/0037415 A1* | 2/2011 | Juestel .................... F21K 9/00 315/297 |
| 2011/0221330 A1 | 9/2011 | Negley et al. |
| 2012/0230010 A1* | 9/2012 | Kato ................... C09K 11/7734 362/84 |

FOREIGN PATENT DOCUMENTS

| | | |
|---|---|---|
| EP | 2211083 A1 | 11/2008 |
| JP | 2004003098 A | 1/2004 |
| JP | 2005093985 A1 | 4/2005 |
| JP | 2007507115 A | 3/2007 |
| JP | 2008010470 A | 1/2008 |
| JP | 2008034188 A | 2/2008 |
| JP | 2008066297 A | 3/2008 |
| JP | 2008523583 A | 7/2008 |
| JP | 2009236486 A | 10/2009 |
| JP | 2011512637 A | 4/2011 |
| JP | 2011513996 A | 4/2011 |
| JP | 201159809 A | 8/2011 |
| WO | WO2009114390 A2 | 9/2009 |
| WO | WO2010040327 A1 | 4/2010 |

\* cited by examiner

WHITE LIGHT EMITTING MODULE

CROSS-REFERENCE TO PRIOR APPLICATIONS

This application is the U.S. National Phase application under 35 U.S.C. § 371 of International Application No. PCT/IB2013/052681, filed on Apr. 4, 2013, which claims the benefit of U.S. Provisional Patent Application No. 61/621,046 filed on Apr. 6, 2012, European Patent Application No. 13159589.4, filed on Mar. 15, 2013 and European Patent Application No. 12163539.5 filed on Apr. 10, 2012. These applications are hereby incorporated by reference herein.

FIELD OF THE INVENTION

The present invention relates to light emitting modules adapted to produce output spectra having desirable spectral composition, and to the use of such light emitting modules.

BACKGROUND OF THE INVENTION

Light sources or illumination devices consisting of light emitting diodes (LEDs) are increasingly used for replacing conventional light sources such as incandescent lamps and fluorescent light sources. LEDs offer many advantages compared to conventional light sources, especially when it comes to light conversion efficiency. However, one disadvantage is that LEDs generate light in a relatively narrow spectral band.

In many applications, such as retail applications and environments, the standard with respect to for example color rendition is set by light sources such as the Philips CDM-Elite. The CDM-Elite lamp has high quality of light and an excellent white rendition. The term "white rendition" refers to a desired improved white appearance of a white object being illuminated by a light source. When LED-based light sources are used to replace traditional lighting systems, they are especially required to generate light that is perceived as white.

Color reproduction is typically measured using the color rendering index (CRI), which is calculated in Ra. The CRI is sometimes also referred to as color rendition index. The CRI is a quantitative measure of the ability of a light source to reproduce the colors of various objects faithfully in comparison with an ideal or natural light source. Daylight has a high CRI, where Ra is approximately 100. Incandescent bulbs are relatively close with an Ra greater than 95 and fluorescent lighting is less accurate with an Ra of typically 70-90.

Consequently, in order to achieve the desired "white" light in LED-based lighting applications, light sources with a high CRI are desirable. For LED lighting systems there are warm-white or neutral-white LED modules with a color rendering of about 80-90 readily available. Although the color rendition of these sources is good, white objects viewed under these light sources appear somewhat less white compared to the standard conventional alternatives. In some applications, this may be a disadvantage for these LED modules, especially for the mentioned retail applications where lamps having excellent white rendition, often referred to as "crisp white", are preferred.

The term chromaticity is used to identify the color of a light source regardless of its brightness or luminance. In particular, the chromaticity of a light source can be represented by chromaticity coordinates, or color points in the 1931 CIE Chromaticity Diagram or the 1976 CIE Chromaticity Diagram (Commission International de l'Eclairage). The color temperature of a light source is defined in terms of an ideal, purely thermal light source also known as a blackbody radiator, whose light spectrum has the same chromaticity as that of the light source. The color temperature is measured in Kelvin (K). The so called black body locus (or line) is the path or line that the color of an incandescent black body would take in a particular chromaticity space as the blackbody temperature changes.

Many attempts have been made relating to improvement of the white light illumination of LED sources. US 2007/0284563 discloses a light emitting device including at least three different LEDs to emit light in the blue, green or red wavelength range, optionally a fourth LED having a peak emission wavelength of 410-460, and also including a wavelength conversion means to convert primary light into secondary light. Using LEDs having narrow emission ranges and a phosphor emitting yellow-green or orange light having relatively wide emission wavelength ranges high color rendering ability is achieved. According to US 2007/0284563, a high CRI (>90) can be achieved.

However, although the light is generally perceived as white and has good color rendering, the white light is still not the "crisp white" desired for many applications. Hence, there is still a need for an efficient solution for providing the desired white light having improved white rendition in LED applications.

SUMMARY OF THE INVENTION

It is an object of the present invention to overcome this problem, and to provide a white light emitting module that can produce a "crisp white" effect.

In view of the above it is desirable to provide a light emitting module which is able to generate a white light spectrum with an improved white rendition. In particular, it is an object of the present invention to provide a light emitting module which can generate light having an excellent white rendering, and which can produce a so called "crisp white" effect.

According to a first aspect of the invention, these and other objects are achieved by a light emitting module adapted to produce white output light having an emission peak in the wavelength range from 400 to 440 nm, comprising:
  at least one first light emitting element adapted to emit light having an emission peak in a first wavelength range from 440 to 460 nm;
  at least one wavelength converting material arranged to receive light emitted by said first light emitting element, and being capable of emitting light having an emission peak in the green to red wavelength range; and
  at least one second light emitting element adapted to emit light having an emission peak in a second wavelength range from 400 to 440 nm.

According to a second aspect, the above objects are achieved by a light emitting module adapted to produce white output light having an emission peak in the wavelength range from 400 to 440 nm, comprising:
  at least one blue emitter for providing light having an emission peak wavelength in a first wavelength range from 440 to 460 nm;
  at least one deep blue emitter for providing light having an emission peak in a second wavelength range from 400 to 440 nm, and at least one wavelength converting material arranged to receive light produced by said at least one blue emitter, and being capable of converting light of from 440 to 460 nm into light having an emission peak in the green to red wavelength range, wherein said light-emitting module is adapted to produce a ratio (A') of the integral spectral power distribution of light of the wavelength range from 380 to 430 nm to the integral spectral power distribution of the total output light produced by the light emitting module defined by $$\frac{\int_{380}^{430} E(\lambda)d\lambda(430-\lambda)}{\int_{380}^{780} E(\lambda)d\lambda} = A',$$ (Equation 1b)

wherein 0.6≤A'≤3.

As used herein, "deep blue" or "short wavelength blue" denotes blue light of the wavelength range from 380 and up to 440 nm. The second light emitting element according to the invention has an emission peak wavelength in the range of from 390 to 440 nm, typically from 400 to 440 nm. Hence, light below the peak wavelength may also be within the "short wavelength blue" range.

Furthermore, as used herein, "blue", "regular blue", "normal blue" or "standard blue" generally refers to light having a peak wavelength in the range of from 440 to 460 nm.

As used herein, "light emitting element" refers to a light emitting semiconductor structure, such as an LED chip or die. A light emitting diode may comprise one or more light emitting elements.

As used herein, in particular with respect to the above-described second aspect of the invention, "emitter" refers to a source of light of a particular wavelength range. The term "emitter" is intended to include a light emitting element as well as a fluorescent or luminescent material, such as a wavelength converting material.

Hence, a light emitting module according to the second aspect of the invention may comprise a deep blue emitter, typically in the form of a deep blue light emitting element, a blue emitter in the form of a blue light emitting element or a blue wavelength converting material (capable of converting part of the deep blue light into normal blue), and another wavelength converting material for converting part of the normal blue light into light of the green to red wavelength range. Alternatively, a light source according to the second aspect of the invention may comprise a normal blue light emitting element (corresponding to the first light emitting element according to the first aspect of the invention), a deep blue light emitting element (corresponding to the second light emitting element according to the first aspect of the invention), and a wavelength converting material for converting part of the normal blue light into light of the green to red wavelength range.

In a study, the present inventors found that by adding a certain amount of short wavelength blue light (also referred to as "deep blue") to the spectrum, an excellent white rendition can be achieved also for LED modules. Thus, the present invention is based on the realization that by adding a certain amount of short wavelength blue light to the output spectrum, an excellent white rendition can be achieved.

Hence, according to the present invention the light emitting module produces an output light spectrum having an intensity peak somewhere in the wavelength range of 400-440 nm, preferably in the range of 400-425 nm or 400-420 nm. In contrast to the device of US 2007/028563, which uses a blue LED having a peak emission wavelength in the range 410-460 nm in combination with a phosphor which undoubtedly is provided to convert the light into longer wavelengths, the contribution from the "deep blue" emitter or light emitting element of the invention is to a large extent preserved in the total output spectrum and thereby provides a "crisp white" effect.

To further improve the white appearance the color point of the light emitting module according to embodiments of the invention may be tuned to lie below the black body line (BBL), in particular for low correlated color temperatures, CCTs (typically 4000 K or less).

It has been established an object appears whiter either if it appears brighter, or if it appears achromatic or slightly chromatic with a blue tint. Hence, a bluish color point is perceived as more white than a color point that lies on the black body line (BBL). It is therefore possible to obtain "crisp" white light by tuning the color point of a light source far below the BBL by addition of normal blue. This will however result in a color point outside the ANSI (American National Standards Institute) color space, which defines acceptable variations for an LED light source of a determined color temperature (e.g. 3000 K), also referred to as "ANSI bins". However, the present inventors have found that by adding short wavelength blue light according to the invention rather than normal blue, the final color point may again be located within the ANSI space, and still give excellent white rendering, including "crisp white". It may be noted that the addition of the short wavelength blue is not particularly meant to increase the CRI, but to provide a desired "crisp white" effect.

FIG. 15a is a schematic illustration of a part of the CIE 1931 chromaticity diagram indicating the black body line around 3000 K and the ANSI color space for a color temperature of 3000 K.

The color point may also be represented in the 1976 CIE chromaticity diagram. FIG. 15b shows the black body line at around 3000 K in the 1976 CIE chromaticity diagram, including the ANSI color space in this diagram for a color temperature of 3000 K. The 1976 CIE diagram is sometimes considered more suitable for representing shifts in color points perceived by the human eye.

In embodiments of the invention, the light generated by the light emitting module may have a color point in the CIE 1931 chromaticity diagram or the 1976 CIE chromaticity diagram which lies on the black body line.

In embodiments of the invention, the light generated by the light emitting module may have a color point in the CIE 1931 chromaticity diagram or the 1976 CIE chromaticity diagram which lies below or slightly below the black body line. When the color point of the light generated by the light emitting module is tuned at little bit below the black body line (this further improves the white appearance of an illuminated white object.

In some embodiments, the, the light generated by the light emitting module may have a color point in the CIE 1931 chromaticity diagram or the 1976 CIE chromaticity diagram which lies within the ANSI color space for the respective color temperature of the light emitting module.

The light emitting module according to embodiments of the invention may be adapted to produce white output light having an emission peak in the wavelength range from 400 to 435 nm, e.g. from 405 to 420 nm, such as from 405 to 415 nm or from 410 to 420 nm. The second wavelength range may thus be from 400 to 435 nm, e.g. from 405 to 420 nm, such as from 405 to 415 nm or from 410 to 420 nm.

Further, the light emitted by the wavelength converting material may be from 500 to 780 nm, typically from 500 to 600 nm, e.g. from 500 to 560 nm.

In embodiments of the invention, the light emitting module comprises at least two different wavelength converting materials. For example, one wavelength converting material may be capable of emitting light having an emission peak wavelength in the range of from 500 to 600 nm (representing green-yellow) and one wavelength converting material may be capable of emitting light having an emission peak wavelength in the range of from 600-780 nm (representing orange or red).

In embodiments of the invention, a major portion of the light emitted by the second light emitting element (according to the first aspect of the invention) is not converted by the green/yellow/red wavelength converting material. Instead, this deep blue light may form part of the total output spectrum and thus may contribute to a crisp white effect. Accordingly in embodiments of the second aspect of the invention, a major portion of the light emitted by the deep blue emitter is not converted by the green/yellow/red wavelength converting material.

In embodiments of the invention the wavelength converting material has an absorption peak wavelength of higher than 440 nm.

In embodiments of the invention, the wavelength converting material is a cerium-doped garnet. Cerium-doped garnets have light absorption and emission characteristics that are very suitable for application in the present invention.

In embodiments of the invention, the light emitting module does not comprise any further type of light emitting element in addition to said first and second light emitting elements.

In embodiments of the invention, the light emitting module comprises a plurality of first light emitting elements as defined above and one or more of said second light emitting element, wherein the number ratio of said first light emitting elements to said second light emitting element(s) is from 10:1 to 2:1. Such as ratio of first to second light emitting elements may provide a suitable spectral composition of output light.

In embodiments of the invention also the light emitting module according to the first aspect of the invention is adapted to produce a ratio A' of the integral spectral power distribution of light of the wavelength range from 380 to 430 nm to the integral spectral power distribution of the total output light produced by the light emitting module, which is defined by $$\frac{\int_{380}^{430} E(\lambda)d\lambda(430-\lambda)}{\int_{380}^{780} E(\lambda)d\lambda} = A',$$ (Equation 1b)

wherein 0.6≤A'≤3. These values of A' have been shown or at least been predicted to provide a desirable crisp white light effect.

In embodiments of the invention, the wavelength converting material is arranged remotely from said first light emitting element or said semiconductor-based light emitting element, respectively. Hence, the wavelength converting material may be a remote phosphor element. Optionally the wavelength converting material may also be arranged remotely from said second light emitting element.

In embodiments of the invention, at least a portion of the wavelength converting material may be provided on the first light emitting element or semiconductor-based light emitting element, respectively, and may thus form a phosphor-converted white light emitting diode. Optionally, another portion of said wavelength converting material may be arranged on the second light emitting element.

Alternatively, in embodiments of the invention, the second light emitting element may lack a wavelength converting material.

An additional benefit of the light emitting module according to some embodiments of the invention is that it may solve or alleviate problems relating to uneven spectral distribution of the emitted light at different viewing angles, also referred to as "color over angle" problems. In conventional phosphor converted LEDs the output light contains less blue light at large emission angles, since blue light emitted at large angles are converted to a higher extent due to its longer path through the phosphor. Conventional ways of solving this problem for white phosphor converted LEDs can be adding scattering to the phosphor layer (which however lead to reduced efficiency) or a dichroic filter on top of the phosphor.

However, advantageously, the addition of a second (although short wavelength) blue LED according to the invention results in a Lambertian emission for the major portion of blue light emitted by the module, so that the emitted light is more homogeneous with respect to color over various viewing angles.

In another aspect, the invention provides a method of producing white light using a light emitting module as described above, comprising operating at least the first and second light emitting elements, or the deep blue emitter, respectively, to produce output light having a ratio A' of the integral spectral power distribution of light of the wavelength range of 380-430 nm to the integral spectral power distribution of the total output light produced by the light emitting module, defined by $$\frac{\int_{380}^{430} E(\lambda)d\lambda(430-\lambda)}{\int_{380}^{780} E(\lambda)d\lambda} = A',$$ (Equation 1b)

wherein 0.6≤A'≤3.

In embodiments of the invention, the light emitting module may be adapted for generating light with a white light spectrum having a desired white rendition relating to an improved white appearance of a white object illuminated by said light emitting module. Such a light emitting module may comprise:
  at least one primary light emitting diode element arranged to emit white light, said primary light emitting diode element, and
  at least one secondary light emitting diode element arranged to emit short wavelength blue light having a peak wavelength between 400 and 440 nm.

By adding a certain amount of short wavelength blue to the light spectrum, an excellent white rendition can be achieved. There is a possibility of making crisp white by tuning the color point far below the BBL. This will result in a color point outside the ANSI color space; however by adding a short wavelength blue, the final color point will be in the ANSI space, with excellent white rendering.

In some embodiments, the light emitting module generates light having a color point in the CIE 1931 chromaticity diagram which lies within the ANSI color space. The generated light may have a color point in the CIE 1931 chromaticity diagram which lies below the black body line.

In embodiments of the invention, the primary light emitting diode element comprises at least one phosphor capable of emitting light in the green to red wavelength range. Thus, said at least one primary light emitting diode element may comprise at least one phosphor-converted white light emitting diode. The at least one primary light emitting diode element may comprise at least one yellow/green/red phosphor converted blue light emitting diode. That is, a blue light emitting diode may be combined with a yellow/green/red phosphor to produce white light.

The white light spectrum generated by the light emitting module may have a color rendering index (CRI) of 80 or 90.

In some embodiments, said secondary light emitting diode element typically does not comprise a phosphor. Alternatively, in other embodiments, said at least one secondary light emitting diode element comprises phosphor. For example, the secondary light emitting diode element arranged to emit short wavelength blue light may comprise yellow/green/red phosphor. Hence, part of the blue light of the short wavelength light emitting diode may be converted using a phosphor layer.

The phosphor layer of the short and long wavelength blue channel may be different in composition and thickness.

In some embodiments, the at least one yellow/green/phosphor converted blue light emitting diode may have a peak wavelength between 440 and 460 nm and the at least one secondary light emitting diode element is arranged to emit short wavelength blue light having a peak wavelength between 400 and 440 nm.

In embodiments of the invention, the light emitting module may further comprise at least one direct red light emitting diode.

In some embodiments, the at least one primary light emitting diode element and the at least one secondary light emitting diode element may be arranged on a light emitting diode board comprising a yellow/green/red phosphor.

In another aspect, the invention provides a method for generating light with a white light spectrum having a desired white rendition relating to an improved white appearance of a white object illuminated by a light emitting module, the method comprising the steps of:

arranging, in said light emitting module, at least one primary light emitting diode element to emit white light, and arranging, in said light emitting module, at least one secondary light emitting diode element to emit short wavelength blue light.

The light emitting module may be a light emitting module as defined above.

In yet another aspect, the invention provides use of (or a method of using) a light emitting module as described herein for illuminating an object comprising a fluorescent whitening agent.

Finally, in a further aspect, the invention provides a lamp, a spotlight or a luminaire comprising at least one light emitting module as described herein.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

As illustrated in the figures, the sizes of layers and regions are exaggerated for illustrative purposes and, thus, are provided to illustrate the general structures of embodiments of the present invention. Like reference numerals refer to like elements throughout.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

Figure 1:
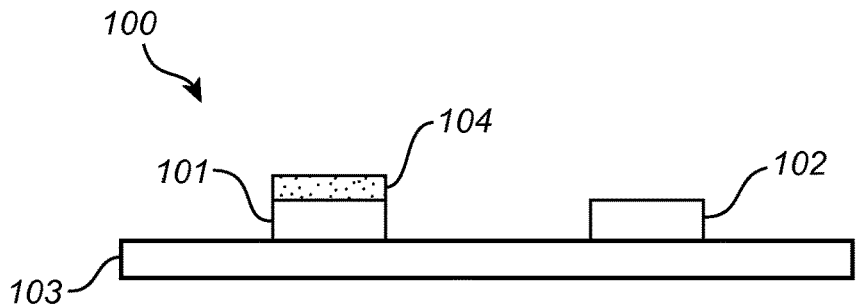
FIG. 1 is a schematic side view of a light emitting arrangement according to embodiments of the invention.

FIG. 1 illustrates an embodiment of the present invention in the form of a light emitting arrangement 100 which may form part of a light emitting module equipped with driving electronics etc., as appreciated by a skilled person. The light emitting arrangement 100 comprises a first light emitting element 101 and a second light emitting element 102 arranged on a support 103. The first light emitting element 101, here a first light emitting diode (LED) chip, is adapted to emit light in the blue wavelength range, in particular from 440 to 460 nm. A wavelength converting material 104, also referred to as a phosphor, is arranged on the first LED chip 101, e.g. as a layer.

The wavelength converting material 104 is adapted to convert part of the blue light emitted by the first LED 101 into light of longer wavelengths, typically of the green to red spectral range, so that the resulting combination of blue light (440-460 nm) and green to red light is perceived as white. Hence it may be a yellow, green or red phosphor. The LED chip 101 in combination with the wavelength converting material 104 may be referred to as a phosphor-converted white LED chip.

Further, the second light emitting element 102, here a second LED chip, is adapted to emit short wavelength blue light, typically in the wavelength range from 400 to 440 nm. In this embodiment, the second LED chip 102 lacks a wavelength converting material, and may be referred to as a direct emitting LED chip.

During operation, light emitted from the first LED chip will be partially converted by the wavelength converting material 104 to yield white light having a conventional spectral distribution. However, the light emitted by the second LED chip will not be converted by any wavelength converting material, and thus will provide a spectral contribution to the total light output from the light emitting arrangement in the form of an emission peak in the wavelength range from 400 to 440 nm. Hence, the light emitting arrangement 100 yields white output light having an additional emission peak in the wavelength range from 400 to 440 nm, which result from the second LED chip 102.

In some embodiments, the second LED chip 102 may be adapted to emit light in the wavelength range from 400 to 435 nm.

The support 103 may be or form part of any suitable physical and/or functional support structure, including a printed circuit board (PCB). The support 103 may carry means for electrical connection required for the light emitting elements 101, 102. Optionally, parts of the support 103 may be reflective.

It is also contemplated the light emitting arrangement 100 may be surrounded by at least one reflective wall, optionally forming a light mixing chamber.

The wavelength converting materials used in the present invention may be inorganic phosphors emitting in the green to red wavelength range.

Examples of suitable wavelength converting materials include, but are not limited to, cerium (Ce) doped garnets, such as Ce doped YAG ($Y_3Al_5O_{12}$), also denoted YAG:Ce or Ce doped LuAG ($Lu_3Al_5O_{12}$), also denoted LuAG:Ce. YAG:Ce emits yellowish light, whereas LuAG:Ce emits yellow-greenish light. Alternatively, a YAG:Ce material in which some of the yttrium is replaced with gallium (Ga) (thus emitting yellowish-greenish light) may be used.

The absorption maximum of YAG:Ce is typically at around 455 nm. The absorption maximum of LuAG:Ce is typically at around 445 nm. Using YAG:Ce in the present invention, a CRI of 80 may be achieved. However using LuAG:Ce, a higher CRI, up to 90, may be achieved.

Examples of inorganic phosphor materials which emit red light may include, but are not limited to ECAS (ECAS, which is $Ca_{1-x}AlSiN_3:Eu_x$ wherein $0<x\leq 1$; preferably $0<x\leq 0.2$) and BSSN (BSSNE, which is $Ba_{2-x-z}M_xSi_{5-y}Al_yN_{8-y}O_y:Eu_z$ wherein M represents Sr or Ca, $0\leq x\leq 1$ and preferably $0\leq x\leq 0.2$, $0\leq y\leq 4$, and $0.0005\leq z\leq 0.05$).

In embodiments of the invention at least two wavelength converting materials may be used. Typically, in such embodiments, one wavelength converting material emits light in the green to yellow spectral range and one wavelength converting material emits light in the red spectral range.

Figure 2:
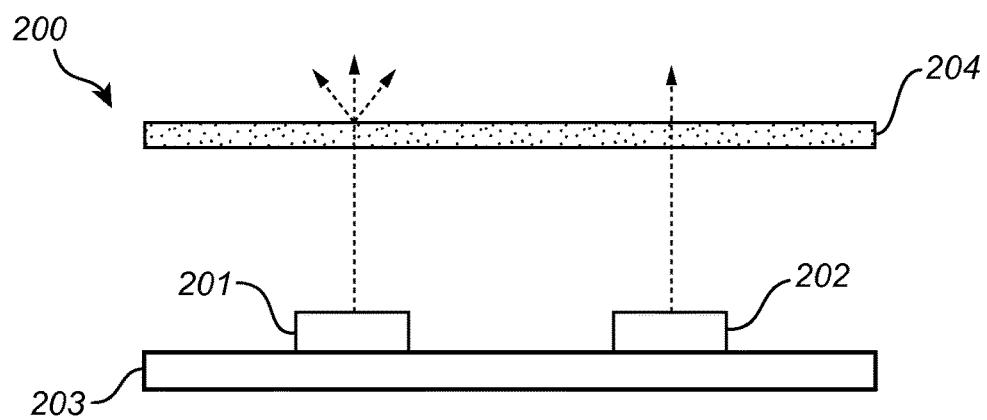
FIG. 2 is a schematic side view of a light emitting arrangement according to another embodiment of the invention.

FIG. 2 shows another embodiment of the invention. In this embodiment, a light emitting arrangement 200 comprises a first light emitting element, here a first LED chip 201, and a second light emitting element, here a second LED chip 202. The first LED chip 201 is adapted to emit blue light of the wavelength range from 440 to 460 nm. The second LED chip 202 is adapted to emit light of the wavelength range from 400 to 460 nm.

In contrast to the embodiment described above with reference to FIG. 1, the first LED chip 201 is not a phosphor-converted LED chip, i.e. does not have a wavelength converting material arranged directly on top of the chip. Instead, in the embodiment shown in FIG. 2, a wavelength converting member 204 comprising a wavelength converting material is arranged remotely from both the first LED chip 201 and the second LED chip 202, to receive light emitted by both LED chips 201, 202. The wavelength converting member 204 may be referred to as a "remote phosphor" or as being in "remote configuration". The wavelength converting member 204 may also be referred to as a remote phosphor layer. The wavelength converting member may be self-supporting and may be provided in the form of a film, a sheet, a plate, a disc, or the like. Although not shown in FIG. 2, the wavelength converting member may be supported by one or more side walls surrounding the light sources 201, 202, such that the wavelength converting member forms a lid or a window.

Typically, the wavelength converting material contained in the wavelength converting member 204 may be adapted to convert blue light into light of longer wavelengths, typically of the green to red spectral range, so that the resulting combination of blue light (440-460 nm) and green to red light is perceived as white. Thus, light emitted by the first LED 201 is received by the wavelength converting member 204 and is partially converted, whereas light emitted by the second LED 202 which is received by the wavelength converting member 204 is not substantially converted, but rather transmitted. The light emitting arrangement 200 hence yields white output light having an additional emission peak in the wavelength range from 400 to 440 nm, which results from the second LED chip 202.

In some embodiments, the wavelength converting member 204 may comprise a wavelength converting material having an absorption maximum above 450 nm, for example at about 455 nm. One example of such a material is YAG:Ce. In such embodiments, the second LED chip 202 may have an emission peak at or near 440 nm, which due to the higher absorption wavelength of the wavelength converting material may still avoid too much conversion of light emitted by the second LED chip 202, in particular light having wavelengths below 435 nm.

In other embodiments, the wavelength converting member 204 may comprise a wavelength converting material having an absorption maximum below 450 nm, e.g. at or around 445 nm. One example of such a material is LuAG:Ce.

Figure 3A:
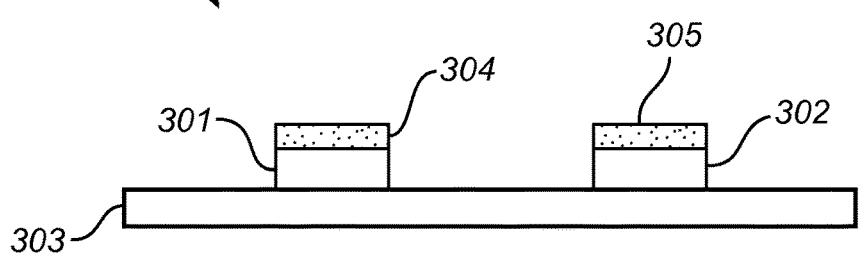
FIG. 3a is a schematic side view of a light emitting arrangement according to another embodiment of the invention.

Another embodiment of the invention is illustrated in FIG. 3a. This figure shows a light emitting arrangement 300 which may form part of a light emitting module, comprising a first light emitting element 301 in the form of a first LED chip, and a second light emitting element 302 in the form of a second LED chip, arranged on a support 303. In this embodiment, both the first LED chip 301 and the second LED chip 302 are so-called phosphor-converted LED chips. The first LED chip 301 is provided with a first wavelength converting material 304, and the second LED chip 302 is provided with a second wavelength converting material 305. The first and second wavelength converting materials 304, 305 may be of the same material or different materials.

Typically, the first LED chip 301 is adapted to emit light in the wavelength range from 440 to 460 nm. The first wavelength converting material 304 converts part of this light into light of longer wavelengths, so that the total emission from the phosphor-converted first light emitting element 301 including the wavelength converting material 304 is perceived as white. Furthermore, the second LED chip 302 typically emits light in the wavelength range from 400 to 440 nm and the wavelength converting material 305 receives and converts part of this light into light of longer wavelengths, so that also the total emission from the light emitting element 302 including the wavelength converting material 305 is perceived as white. However, a sufficient amount of the light emitted by the second LED chip 302 is not absorbed and converted by the wavelength converting material 305, thus providing an emission peak in the wavelength range from 400 to 440 nm to the total output spectrum of the light emitting arrangement 300.

Figure 3B:
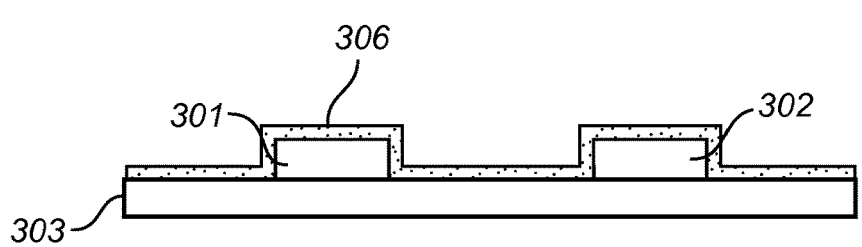
FIG. 3b is a schematic side view of a light emitting arrangement according to another embodiment of the invention.

FIG. 3b illustrates an embodiment similar to that of FIG. 3a, but in which a continuous layer 306 of wavelength converting material is applied directly over both LED chips 301, 302 rather than being arranged in a remote position. The layer 306 may comprise a single wavelength converting material or a combination of wavelength converting materials. The wavelength converting material(s) may be homogeneously distributed throughout the layer 305. The layer 306 may be produced by providing the wavelength converting material(s) in fluid form, e.g. dispersed in a carrier liquid, and dispensing the fluid to cover the light emitting elements 301, 302. Optionally the layer 306 may be cured.

Figure 4:
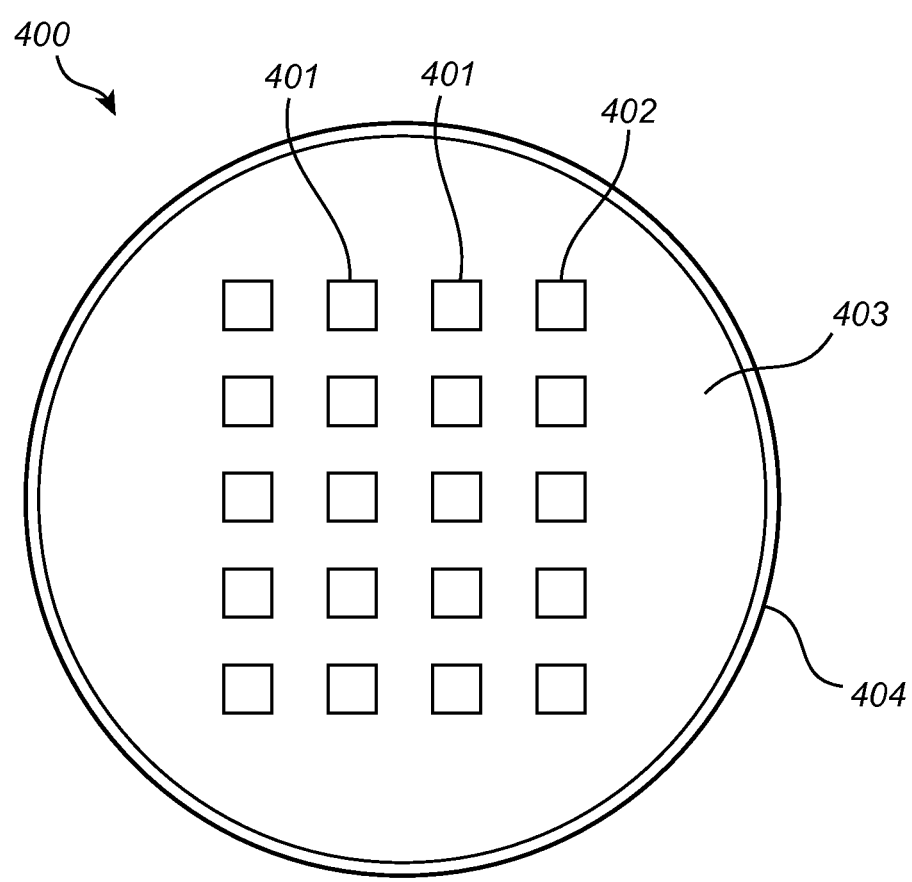
FIG. 4 is a schematic top view of a light emitting arrangement according to another embodiment of the invention.

FIG. 4 shows a top view of a light emitting module 400 comprising a plurality of light emitting diodes, here 20 individual LED chips, arranged on a board or support 403. The module comprises a plurality of first LED chips 401 adapted to emit light of the first wavelength range as defined herein, and at least one second LED chip 402 adapted to emit light of a second wavelength range as defined herein. Typically the module 400 comprises a plurality of said second LED chips 402. A circular side wall 404 of a height exceeding the height of the LED chips 401, 402 is provided at the periphery of the board 403, enclosing the LED chips 401, 402, and may act as a support for an wavelength converting member which may be arranged as a lid or window, remotely from the LED chips 401, 402. Reference is also made to FIG. 2 which shows, a schematic side view of a similar arrangement, however without a side wall 404, and showing only two LED chips. The side wall 404 may have a reflective inner surface facing the LED chips 401, 402, thus forming a reflective light mixing chamber.

Optionally, rather than having a remote wavelength converting member covering the module 400, a wavelength converting material may be provided directly on or in the vicinity of the individual LED chips 401, and optionally also the individual LED chip(s) 402. For example, the LED chips 401, an optionally also LED chips 402, may be phosphor-converted, similar to FIG. 1 or FIG. 3a, respectively. Alternatively, a continuous layer of wavelength converting material may be applied over the LED chips 401 as well as the LED chips 402, similarly to the embodiment described with reference to FIG. 3b.

In any embodiment of the invention described herein, the light emitting arrangement may comprise a plurality of said first light emitting elements and optionally also of said second light emitting elements. Different numbers of the respective first and second light emitting elements may be used in order to obtain a desired intensity ratio of the respective wavelength ranges emitted, in particular when all the light emitting elements are driven by the same current. For example, the number of first light emitting elements to second light emitting element(s) may be from 10:1 to 3:2, in particular from 9:1 to 2:1, e.g. 9:1 to 3:1.

In embodiments of the invention, e.g. as described with reference to FIG. 1, 3 or 4, the first LED chip may be a phosphor converted LED chip, based on a blue LED chip and a yellow or green or red phosphor.

Optionally, e.g. in embodiments as described with reference to FIG. 3 or 4, the second LED chip may be a phosphor-converted LED chip comprising a yellow or green or red phosphor.

In general, the composition and/or the amount, concentration or layer thickness of the wavelength converting material(s) associated with the respective first and second LED chips may be the same or different.

In embodiments of the invention, the light emitting diode may further comprise a red LED chip, typically a direct red LED chip (i.e. not comprising a phosphor).

Optionally, in embodiments of the invention the light emitting module may include a scattering structure, e.g. added to a layer of wavelength converting material. Such a scattering structure may be applied on top of a layer of wavelength converting material, typically downstream thereof in the direction of light from the light emitting diode. Alternatively, a scattering structure may be integrated in the wavelength converting material, e.g. in the form of scattering particles or pores.

Figure 5:
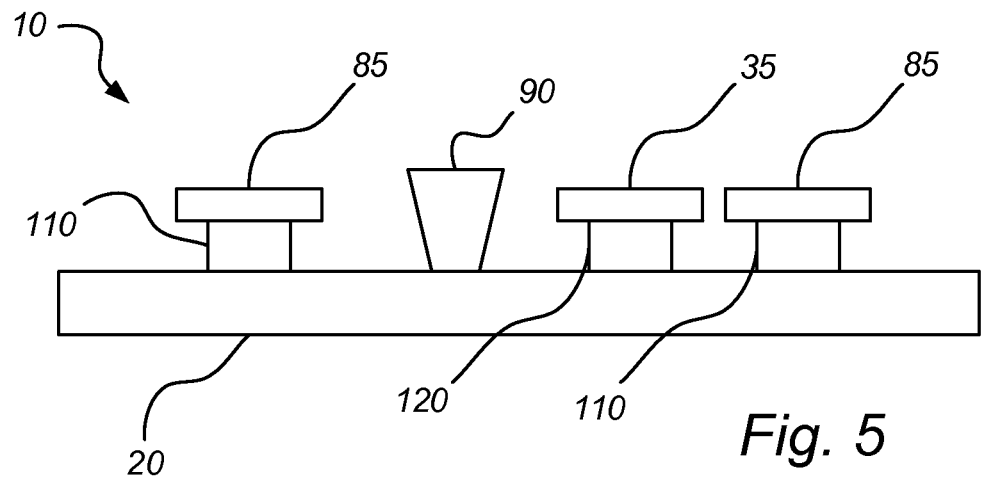
FIGS. 5-8 are schematic illustrations of different embodiments of a light emitting module according to the present invention.
Figure 6:
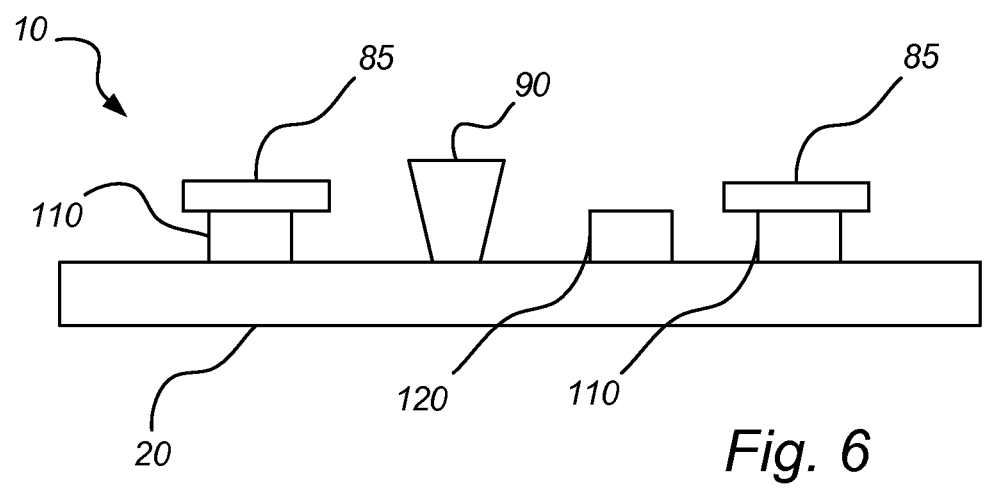
Figure 7:
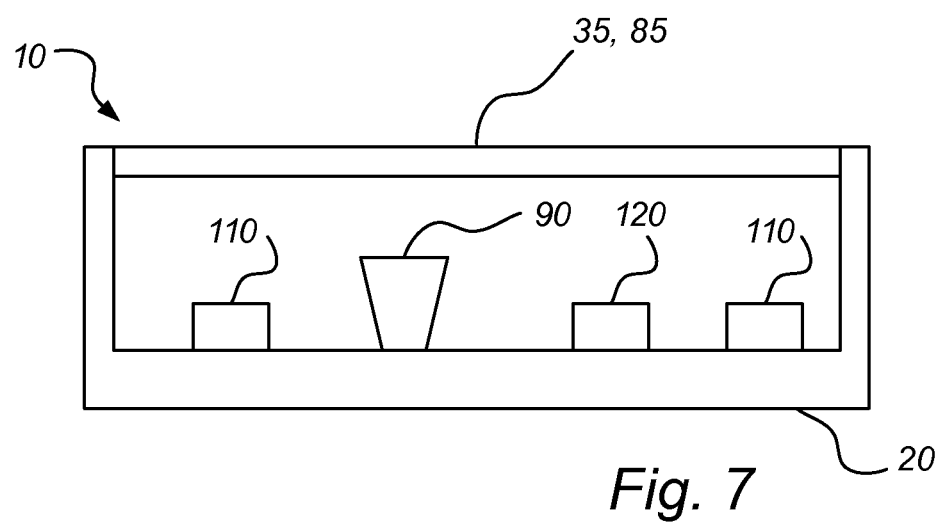

Further embodiments of the invention are illustrated in FIGS. 5-7.

FIG. 5 illustrates an embodiment of a light emitting module 10 according to embodiments of the present invention. The light emitting module 10 comprises an LED board 20 where two blue light emitting diodes 110 are arranged. The two blue light emitting diodes 110 are arranged to emit blue light having a peak wavelength between 440 and 460 nm. The two blue light emitting diodes 110 comprise a wavelength converting material 85, thus forming phosphor-converted LEDs, which may be adapted to emit white light depending on the choice of wavelength converting material. It is noted that any desired number of the LEDs 110, including a single LED 110, may be used.

The light emitting module 10 further comprises a light emitting diode 120 arranged to emit short wavelength blue light having a peak wavelength between 400 and 440 nm.

Further, the light emitting module 10 comprises an optional direct red light emitting diode 90. The direct red light emitting diode 90 may emit light having a wavelength of >600 nm. In this way the resulting white spectrum consists of two blue peaks, a broad yellow/green emission and a sharp red contribution. The at least one yellow/green/ red phosphor converted blue light emitting diode may have a peak wavelength between 440 and 460 nm and the at least one secondary light emitting diode element may be arranged to emit short wavelength blue light having a peak wavelength between 400 and 440 nm.

FIG. 6 illustrates another embodiment of a light emitting module 10 according to an embodiment of the present invention. In this embodiment, the light emitting diode 120 arranged to emit short wavelength blue light does not comprise any phosphor. Similarly to the embodiment of FIG. 5, the module 10 comprises an optional direct red light emitting diode 90. The direct red light emitting diode 90 may emit light having a wavelength of >600 nm. It is noted that any desired number of the respective LEDs, including a single LED 110, may be used.

In another embodiment shown in FIG. 7, the light emitting module 10 comprises two light emitting diodes 110 which are arranged to emit blue light having a peak wavelength between 440 and 460 nm. The light emitting module also comprises a light emitting diode 120 arranged to emit short wavelength blue light having a peak wavelength between 400 and 440 nm, and a direct red light emitting diode 90. In this embodiment, the wavelength converting materials 35,85 are contained in a wavelength converting member provided as a remote phosphor element. In variant of this embodiment, the remote phosphor element comprises only wavelength converting material 35, and lacks wavelength converting material 85.

Figure 8:
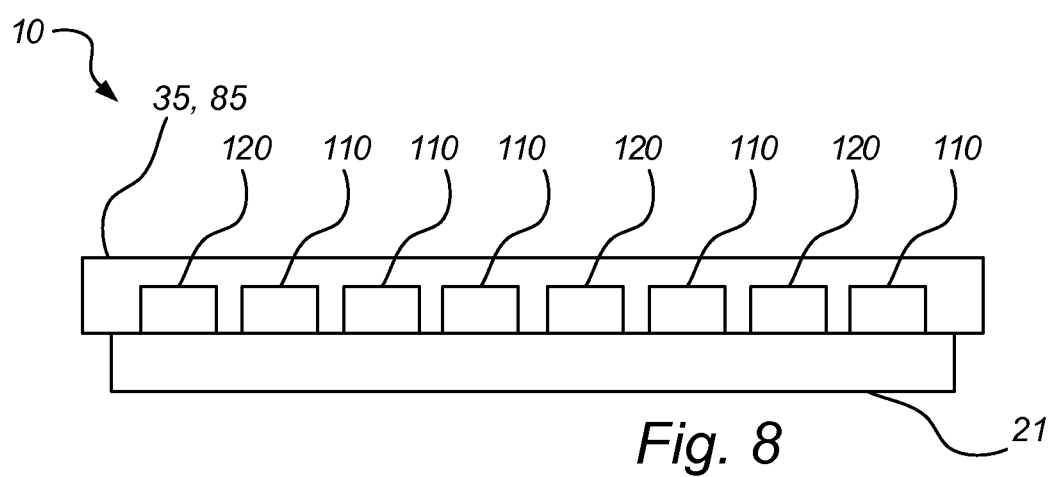

FIG. 8 illustrates another embodiment of a light emitting module 10 comprising a LED board 21 where a number of light emitting diodes 110 are arranged closely together with a number of light emitting diodes 120. The LED board 100 of the light emitting module 10 comprises a yellow/green/red phosphor 35,85 directly applied onto it. This embodiment may be similar to the embodiment described with reference to FIG. 3b.

In the embodiments above, the support 103, 203, 303 or the LED board 20 may be or form part of a chip-on-board structure. The yellow/green/red phosphor may be arranged on the light emitting diode board or in a remote configuration.

The blue light emitting diodes may be positioned in a mixing box and the phosphor may be in the exit window.

A method for generating light with a white light spectrum having a desired white rendition relating to an improved white appearance of a white object illuminated by a light emitting module, may comprise the steps of arranging, in said light emitting module, at least one primary light emitting diode element to emit white light; arranging, in said light emitting module, at least one secondary light emitting diode element to emit short wavelength blue light. The method generates light with a white light spectrum having a desired white rendition relating to an improved white appearance of a white object illuminated by a light emitting module. The method comprises a step where at least one primary light emitting diode element is arranged in the light emitting module. In a subsequent step at least one secondary light emitting diode element is arranged in the light emitting module.

A light emitting module according to embodiments of the invention may advantageously be used for illuminating objects and articles comprising a fluorescent whitening agent (FWA).

The name "fluorescent whitening agents" generally denotes chemical substances that upon excitation by UV light produce blue fluorescence usually with a peak at 445 nm. Fluorescent whitening agents are added to many products, for example paper, fabrics and plastics, in order to improve the white appearance. However, the present inventors have found that fluorescent whitening agents are also susceptible of excitation by short wavelength blue light, which leads to emission of regular blue light, thus contributing to improving the white impression of the illuminated material. In particular, light having a wavelength of 440 nm or lower, especially 420 nm or lower, can excite fluorescent whitening agents. In embodiments of the invention, a second light emitting diode having an emission peak wavelength in the range of from 400 to 440 nm may produce a sufficient intensity of light of ≤420 nm to effectively excite a fluorescent whitening agent.

Figure 14:
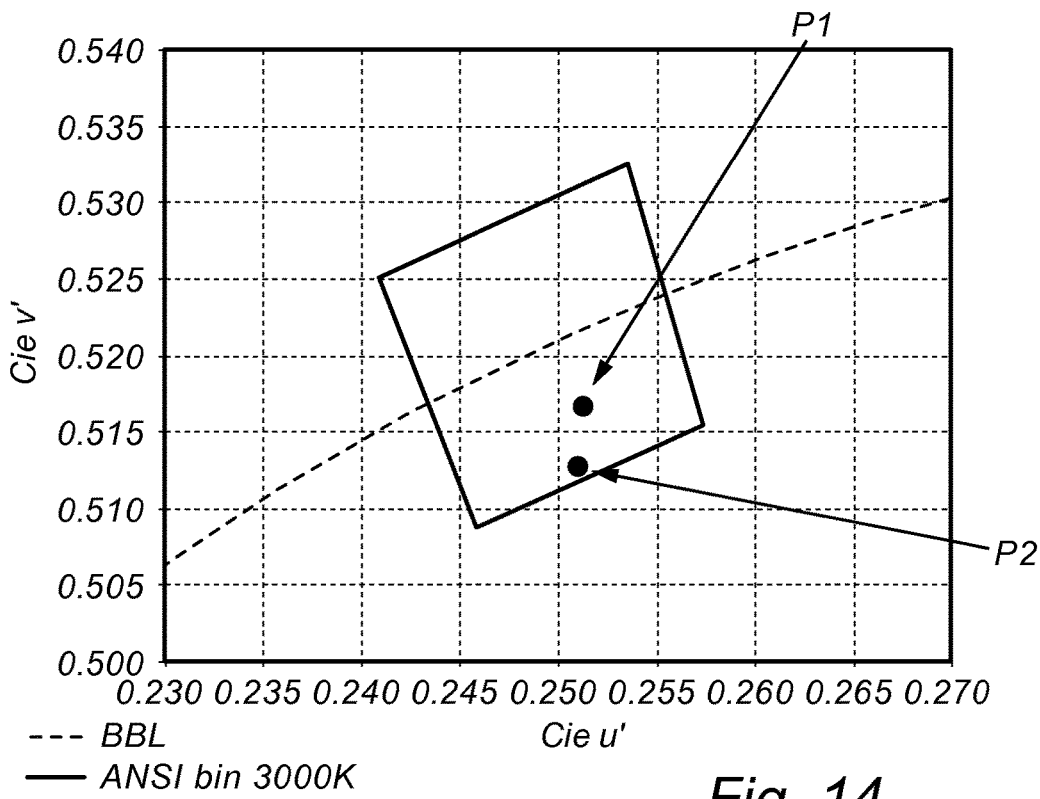
FIG. 14 illustrates the difference in color point between the light emitted by a light emitting module according to embodiments of the invention and the reflected/emitted spectrum of an object comprising a fluorescent whitening agent illuminated with the light emitting module.
Figure 15A:
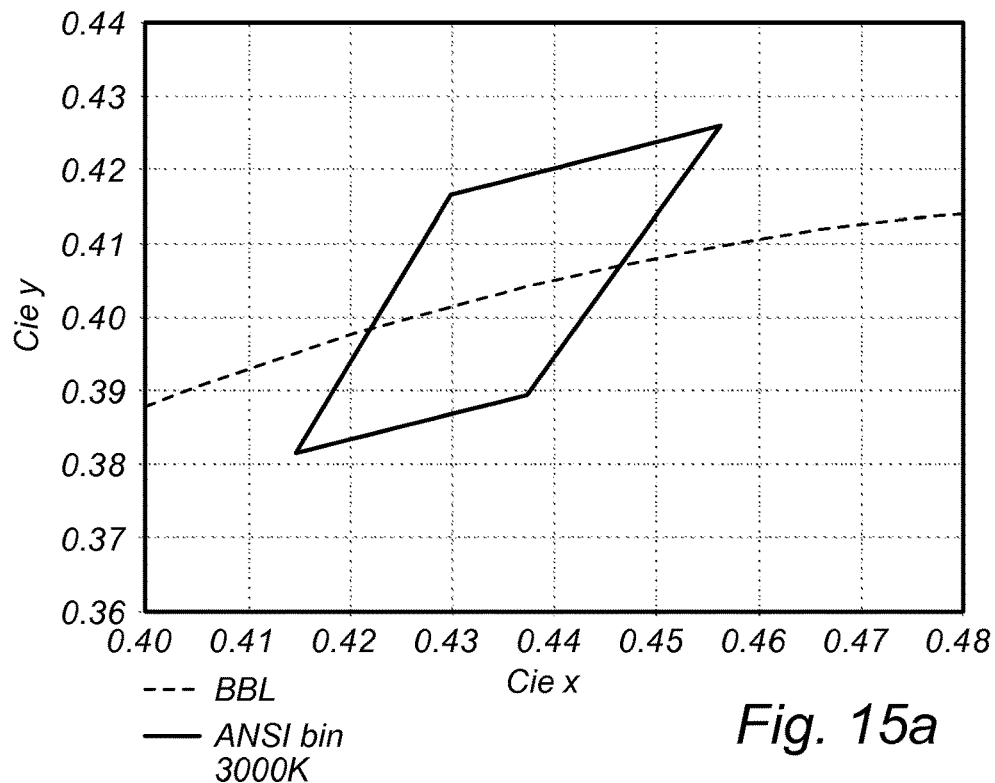
FIG. 15a shows a portion of the 1931 CIE chromaticity diagram including the black body line around a color temperature of 3000 K.
Figure 15B:
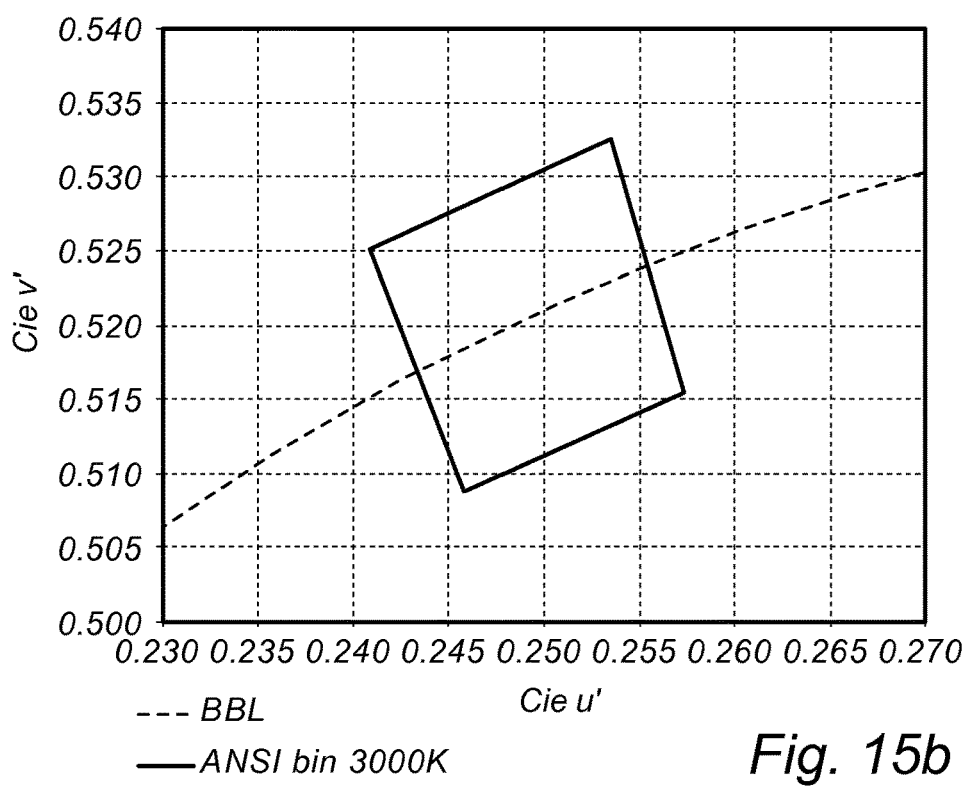
FIG. 15b shows a portion of the 1976 CIE chromaticity diagram including the black body line around a color temperature of 3000 K.

A desirable "crisp white" effect may be represented by the difference (v' shift, Δv' as seen in the 1976 CIE diagram) in color point of the light emitted/reflected by an object containing FWA compared to the light emitted by the light source used for illuminating said object. When the color point of the emitted/reflected light (P2) is shifted further below the black body line compared to the color point of the light (P1) emitted by the light source, this may provide a crisp white effect (FIG. 14). This phenomenon is explained in more detail with reference to Example 2 below. In order to provide a desired improvement in white rendition and a "crisp white" effect, a Δv' of at least −0.002 (−Δv'≥0.002) may be sufficient, in particular where the color point of the light source is already below the BBL. However, depending on the color point of the light source, a larger v' shift, e.g. a Δv' of at least −0.005, may be desirable.

The inventors have found that the "crisp white" effect (e.g., a Δv' of −0.005) obtained when illuminating an object containing a fluorescent whitening agent, using a light emitting module according to embodiments of the invention, is dependent on the intensity ratio of the "deep" blue light (e.g. 380-430 nm) to the total spectrum emitted by the module.

The ratio A of the integral spectral power distribution E(λ) over the "deep blue" wavelength range (here 380-430 nm; cutoff at 430 to avoid contribution from "standard blue" emitter) to the integral spectral power distribution of the total spectrum emitted by the module may be expressed as $$\frac{\int_{380}^{430} E(\lambda)d\lambda}{\int_{380}^{780} E(\lambda)d\lambda} = A \qquad \text{(Equation 1a)}$$

Furthermore, the inventors have found that the intensity required for achieving a desired "crisp white" effect (e.g., a Δv' of −0.006) when illuminating an object containing a fluorescent whitening agent is dependent on the peak wavelength emitted by a light emitting module according to embodiments of the invention. In particular, it was found that at deep blue peak wavelengths in the lower part of the deep blue wavelength range (e.g., 405 nm), the intensity required for achieving a "crisp white" effect (a certain v' shift) was lower than for deep blue emission peak wavelengths in the upper part of the deep blue wavelength range (e.g. 420 nm). Thus, a ratio A' can be defined as follows, taking account of this wavelength dependency:

$$\frac{\int_{380}^{430} E(\lambda)d\lambda(430-\lambda)}{\int_{380}^{780} E(\lambda)d\lambda} = A' \qquad \text{(Equation 1b)}$$

In embodiments of the invention, A' is equal to, or higher than, 0.6, typically at least 0.8, e.g. 0.8≤A'≤3. In embodiments of the invention, 1≤A'≤2. A graph plotting the calculated Δv' as a function of A' is presented in FIG. 18 and described in more detail below (see Example 2).

Further, the ratio B of the integral spectral power distribution E(λ) over the "normal blue" wavelength range to the integral spectral power distribution of the total spectrum emitted by the module may be expressed as $$\frac{\int_{435}^{465} E(\lambda)d\lambda}{\int_{380}^{780} E(\lambda)d\lambda} = B \quad \text{(Equation 2)}$$

Although the first light emitting element used in the present invention (emitting "normal blue" light) has a peak wavelength in the range of from 440 to 460 nm, there will be some emitted light also below the peak wavelength and in order to better account for the total intensity of the light produced by the first light emitting element, the integral spectral power distribution is counted from 435 nm up to 465 nm. In embodiments of the invention, 0≤B≤0.15, i.e. the regular blue light forms less than 10% of the total spectrum.

Using a light emitting module according to embodiments of the invention, with 0.8≤A'≤3 and 0<B<0.15, a crisp white effect and color rendering index of at least 80 may be achieved.

In embodiments of the invention, different numbers of the respective first and second light emitting elements may be used in order to obtain a desired intensity ratio, in particular when all the light emitting elements are driven by the same current. For example, the number of first light emitting element to second light emitting elements may be from 2:1 to 4:1, in particular from 2:1 to 3:1, e.g. around 3:2. For a light emitting module comprising a total of 100 light emitting elements, the number of first light emitting elements may be from 60 to 80, e.g. 72, and the number of second light emitting elements may be from 40 to 20, e.g. 28. Such a light emitting module may provide a Δv' of at least −0.006, a CRI of at least 80, and a luminous flux of at least 2000 lm.

EXAMPLES

Example 1

Figure 9:
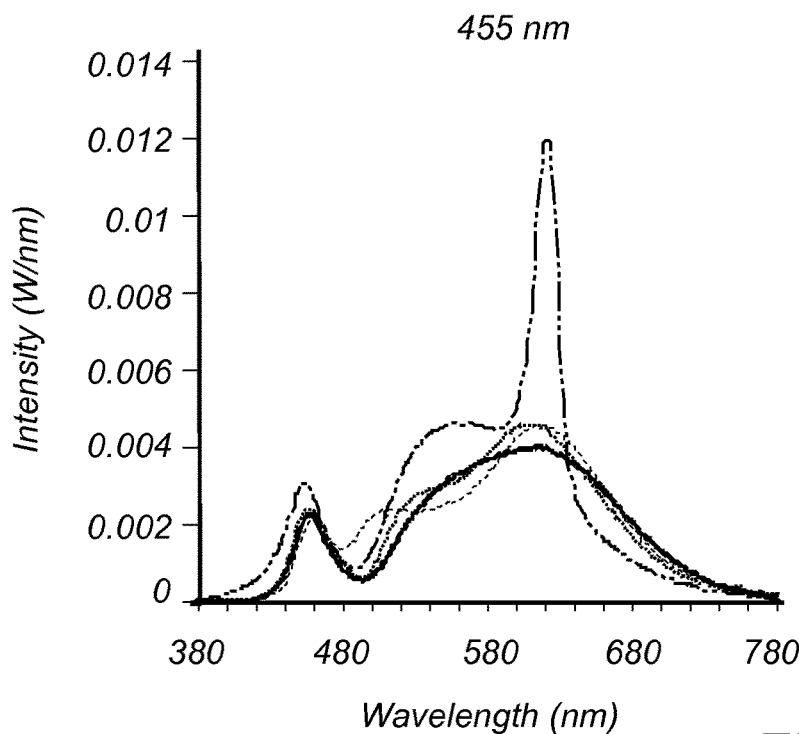
FIG. 9 illustrates various tested white spectra for a conventional 455 nm blue LED pump wavelength.

A 455 nm blue emitting LED was used in combination with different selected phosphors in order to make white light. The green phosphors used were LuAG lumiramic, U821 (LuAG powder) and U822 (YAG powder). The green phosphors were combined with eCAS101, eCAS102 or a direct red LED chip. In FIG. 9 various tested white spectra are shown for these different combinations, where these variations account for the different lines in the graph.

Figure 10:
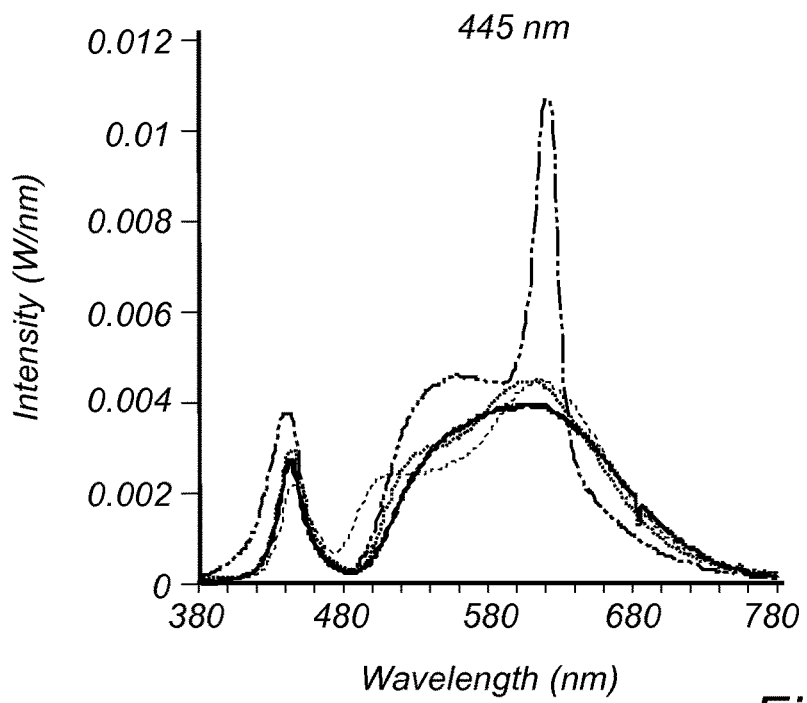
FIG. 10 illustrates various tested white spectra for a conventional 445 nm blue LED pump wavelength.

In the same way, a 445 nm blue emitting LED was used in combination with different selected yellow/green/red phosphors. In a similar way, FIG. 10 illustrates various white spectra for these corresponding combinations. Different phosphor choices are represented by the different lines in both FIG. 9 and FIG. 10.

Figure 11:
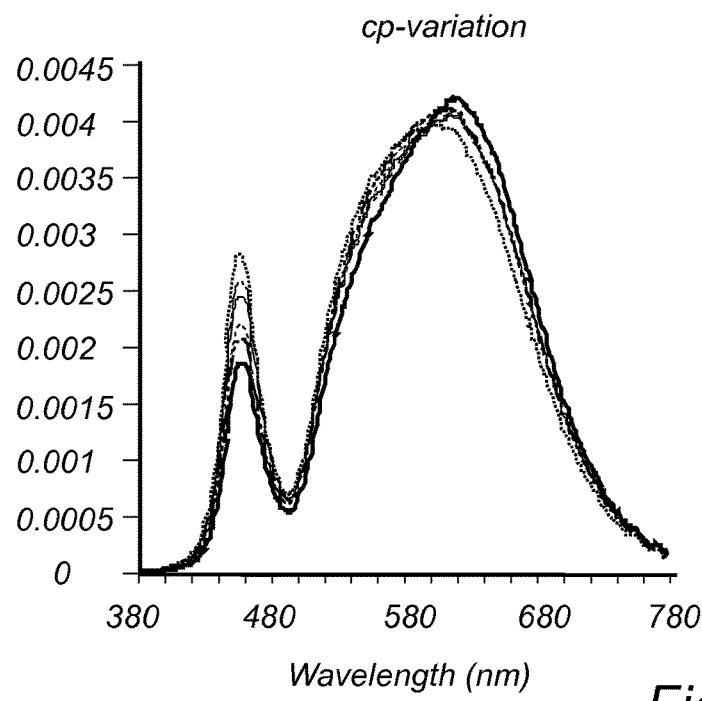
FIG. 11 illustrates variations in color point for one of the combinations from the previous two figures.

For one of the combinations in the previous two figures, light was generated with a small offset in color point. The color point (cp) variation may be along the BBL or perpendicular to the BBL. FIG. 11 illustrates these variations in spectra for one of the combinations.

As already mentioned above, none of these tested spectra gave a white rendering with properties approaching those of a conventional high standard light source.

Figure 12:
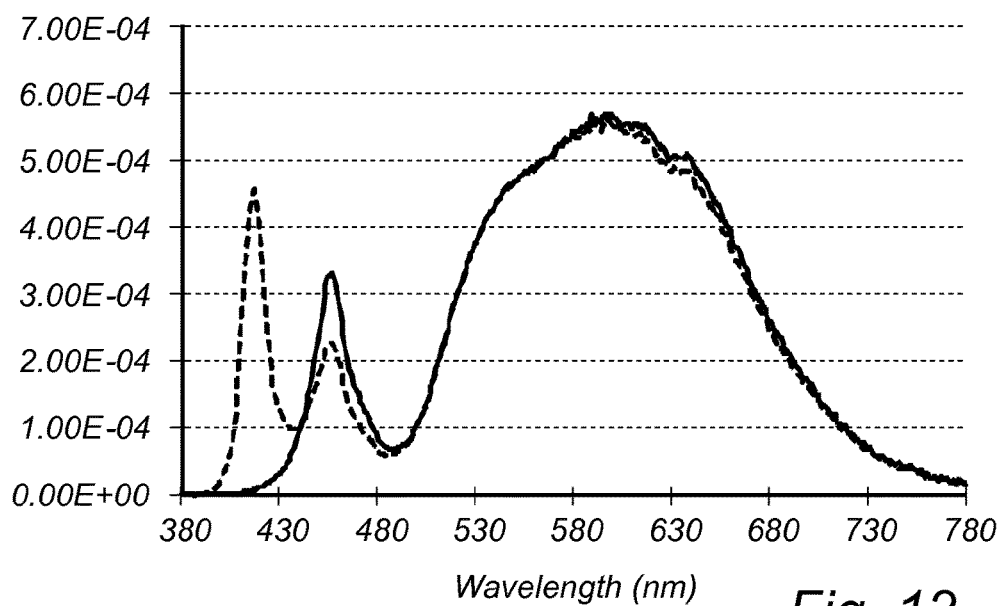
FIG. 12 illustrates one white spectrum with an "excellent" white rendering (dashed line) compared with a white spectrum with an average white rendering (solid line)

However, during this study the inventors found that the addition of short wavelength blue to the spectrum leads to the desired excellent white rendition (crisp white). FIG. 12 illustrates a white spectrum with an "excellent" white rendering (dashed line) compared with a white spectrum with an average white rendering (solid line).

Example 2

A light source comprising 20 normal blue LED chips and 5 deep blue LED chips, and a LuAG:Ce phosphor (U821) and a red phosphor (MCC BR101d) was used to illuminate a white fabric containing a fluorescent whitening agent. The color point of the light source was within the ANSI 3000 K bin.

Figure 13:
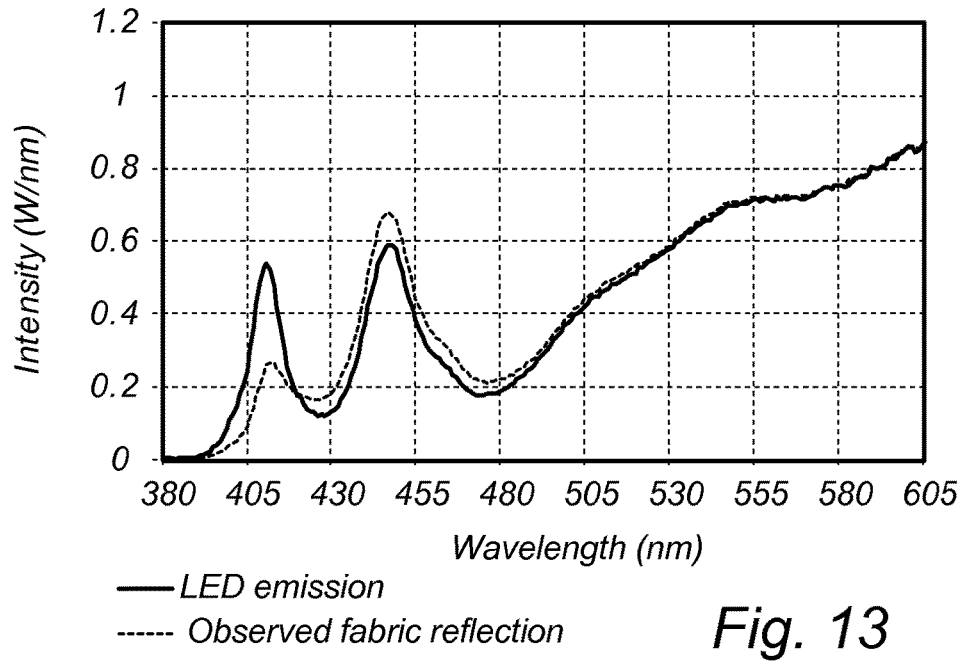
FIG. 13 is a graph illustrating the emission spectrum recorded for a light emitting module according to embodiments of the invention and the reflected/emitted spectrum of an object comprising a fluorescent whitening agent illuminated with the module.

The emission spectrum of the light source was measured, as well as the light reflected by the fabric. These spectra are shown in FIG. 13. As can be seen, the light source spectrum (solid line) has a higher emission intensity peak at 410 nm, whereas the intensity of the light reflected or emitted by the fabric (dashed line) is lower at 410 nm but instead slightly higher in the wavelength range of roughly 420-480 nm.

Also the respective color points of the light from the light source and the fabric were recorded and are shown in FIG. 14. As can be seen in this diagram, the color point P1 of the light emitted by the light source lies below the black body line. However, the color point P2 of the light emitted/reflected by the fabric is shifted further below the BBL and is therefore perceived as more white. In this figure the shift in the v' direction (Δv') is about −0.004.

Figure 16:
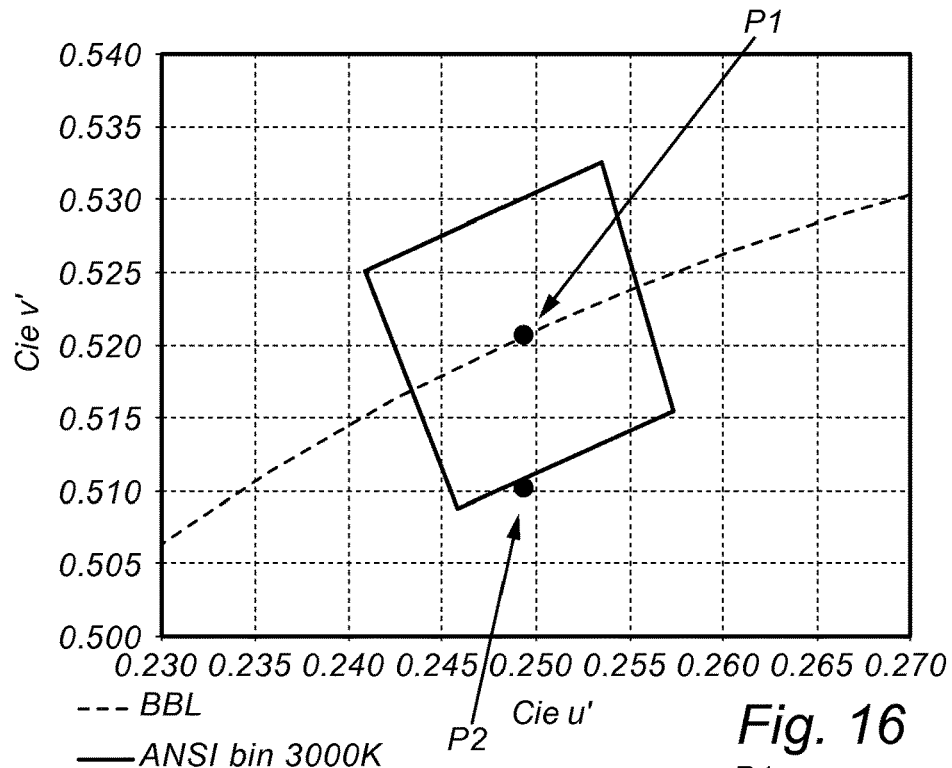
FIGS. 16 and 17 represent theoretical emitted color points in the 1976 CIE chromaticity space for light emitting modules according to embodiments of the invention and corresponding theoretical emitted/reflected color point of objects comprising fluorescent whitening agent illuminated by such light emitting modules.

Theoretical color points of the light from the light source and the fabric were calculated and are shown in FIG. 16. As can be seen in this diagram, the color point P1 of the light emitted by the light source lies on the black body line, and within the ANSI bin 3000 K. However, the color point P2 of the light reflected by the fabric is shifted further below the BBL and lies on the border of or outside of the ANSI bin 3000 K, and is therefore perceived as more white.

Figure 17:
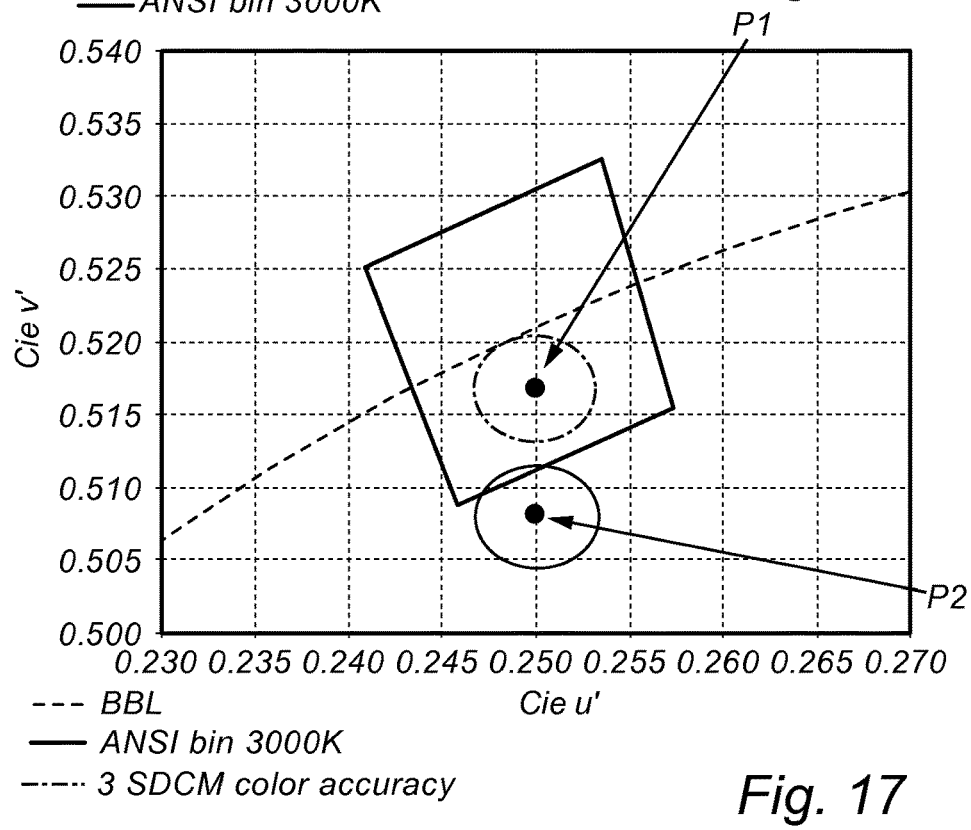

FIG. 17 shows an exemplary theoretical color point (P1) and acceptable color point space (dashed circle) for a light emitting module, and a resulting theoretical color point (P2) and desirable color point space (solid circle) for an FWA containing object illuminated by the light emitting module. Any color point within the dashed circle may be perceived as "crisp white".

In order to provide a desired improvement in white rendition and a "crisp white" effect, the light source should preferably produce a Δv' of at least −0.002 (−Δv'≥0.002). For this purpose, light sources having a deep blue peak wavelength of 420 nm or lower may be preferred.

Relatively high intensity ratios of short wavelength blue light may give satisfactory result with respect to "crisp white" effect. However, for reasons of efficiency and/or to maintain sufficiently high CRI, it may be preferable to use a relatively low ratio of short wavelength blue light to the total output light.

Figure 18:
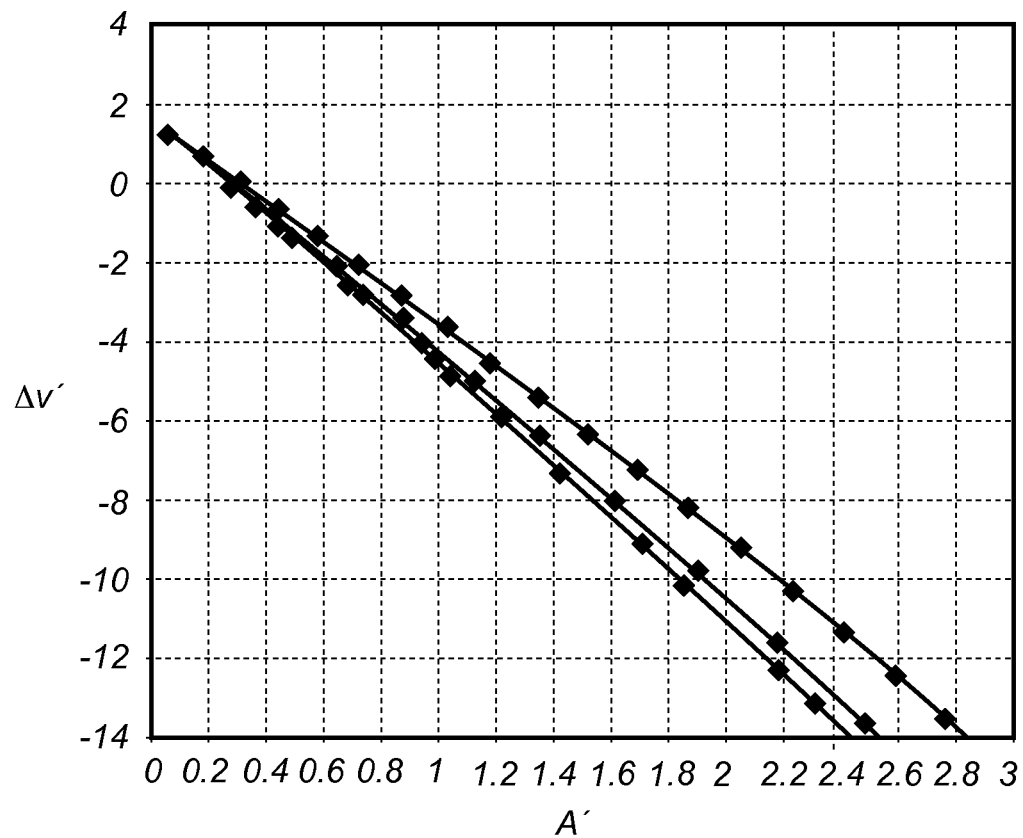
FIG. 18 is a graph plotting the expected color point shift as a function of the intensity ratio A'.

As mentioned above, the inventors investigated the relationship between the peak deep blue wavelength and the intensity ratio A. They found that at deep blue emission peak wavelengths in the lower part of the deep blue wavelength range (e.g., 405 nm), the intensity required for achieving a "crisp white" effect (a certain v' shift) was lower than for deep blue emission peak wavelengths in the upper part of the deep blue wavelength range (e.g. 420 nm), and defined ratio A' (Equation 1b). FIG. 18 is a graph showing the expected Δv' as a function of A', based on earlier experiments (illuminating a white fabric or paper using a light source according to embodiments of the invention). As can be seen from this graph, a ratio A' of 0.6 may result in a Δv' of −0.002. However, it may be desirable to have A'≥0.8 in order to achieve a Δv' of at least about −0.003, and preferably A' may be higher than 0.8, e.g. at least 1 (resulting in a −Δv' of 0.004-0.005).

The light emitting arrangement described herein may form part of a light emitting module for use in various lighting applications. For example, such a light emitting module may be used in a white light source, for example a spotlight or a luminaire, for illuminating objects e.g. in retail or exposition environments. In particular, the light emitting module according to embodiments of the invention, typically comprised in a spotlight, may advantageously be used for accent lighting in retail environments.

Figure 19:
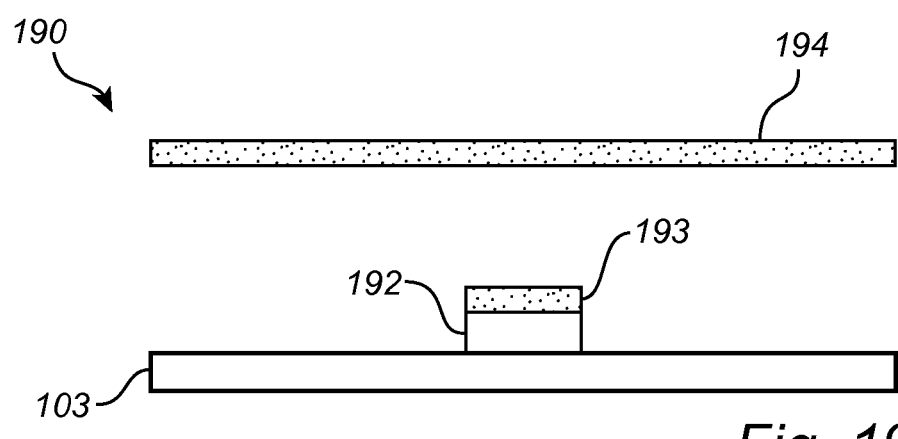
FIG. 19 is a schematic side view of a light emitting arrangement according to a further embodiment of the invention.

The person skilled in the art realizes that the present invention by no means is limited to the preferred embodiments described above. On the contrary, many modifications and variations are possible within the scope of the appended claims. For example, one or both of the first and second light emitting elements described herein may be replaced by a suitable combination of light emitting elements and wavelength converting material, e.g. a UV LED chip and a blue phosphor. Additionally, FIG. 19 illustrates an alternative embodiment of a light emitting arrangement 190 which uses only one type of light emitting element, notably a deep blue emitting LED chip 192 arranged on a substrate 103. A blue wavelength converting material 193 is provided to convert part of the deep blue light emitted by the chip 192 into normal blue light. A wavelength converting material 194 capable of converting normal blue light into light of the green to red wavelength range is provided remotely from the LED chip 192 and the blue wavelength converting material 193, although it is contemplated that the wavelength converting material 194 may also be located in the vicinity of or directly on the blue wavelength converting material 193. Similarly, the blue wavelength converting material 193 may also be located further away from the LED chip 192, however the wavelength converting material 194 may advantageously be provided downstream of the blue wavelength converting material 193 in the path of light.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A light emitting module adapted to produce a crisp white effect when illuminating an object containing a fluorescent whitening agent, comprising:
    a light source configured to emit first output light represented by a first color point in a chromaticity diagram, the first color point being on or below a black body line of the chromaticity diagram, and the first output light being white output light having an emission peak in a wavelength range from 400 to 440 nm, the light source comprising:
        at least one first light emitting element adapted to emit normal blue light having an emission peak in a first wavelength range from 440 to 460 nm;
        at least one wavelength converting material arranged to receive light emitted by said first light emitting element, and being capable of emitting light having an emission peak in the green to red wavelength range; and
        at least one second light emitting element adapted to emit deep blue light having an emission peak in a second wavelength range from 400 nm to 440 nm, and providing a spectral contribution to the first output light emitted from the light source in a form of the emission peak in the second wavelength range from 400 to 440 nm without being converted by any wavelength converting material,
    wherein the light emitting module mixes the light from the first light emitting element, the light from the wavelength converting material, and the light from the second light emitting element to emit the first output light of a sufficient intensity that satisfies a condition of 0.6≤A'≤3 to provide a desirable crisp white light effect when illuminating the object containing the fluorescent whitening agent which is excitable by the first output light, wherein A' is defined as ratio of:

$$\frac{\int_{380}^{430} E(\lambda)d\lambda(430-\lambda)}{\int_{380}^{780} E(\lambda)d\lambda} = A',$$

wherein E(λ) is a spectral power distribution of the light emitted by the light emitting module and λ denotes a wavelength,
    such that when being illuminated by the first output light, the object emits crisp white output light represented by a second color point of the chromaticity diagram, wherein the crisp white output light has the emission peak in the wavelength range from 400 to 440 nm, and the second color point is shifted further below the black body line than the first color point.

2. A light emitting module according to claim 1, wherein the second wavelength range is from 405 to 425 nm.

3. A light emitting module according to claim 1, comprising at least two different wavelength converting materials.

4. A light emitting module according to claim 1, wherein the wavelength converting material has an absorption peak wavelength of higher than 440 nm.

5. A light emitting module according to claim 1, wherein the wavelength converting material is a cerium-doped garnet.

6. A light emitting module according to claim 1, comprising a plurality of said first light emitting element wherein the number ratio of said first light emitting elements to said second light emitting element is from 10:1 to 2:1.

7. A light emitting module according to claim 1, wherein said wavelength converting material is a remote phosphor element.

8. A light emitting module according to claim 1, wherein at least a portion of said wavelength converting material is provided on said first light emitting element and forms a phosphor converted white light emitting diode.

9. A method of producing white light using a light emitting module according to claim 1, comprising
    operating the light emitting module to emit the first output light to the object containing the fluorescent whitening agent, and causing the first output light to be reflected from the object containing the fluorescent whitening agent to produce the crisp white light.

10. Use of a light emitting module according to claim 1 for illuminating an object comprising a fluorescent whitening agent.

11. A lamp, a spotlight or a luminaire comprising at least one light emitting module according to claim 1.

12. A light emitting module adapted to produce a crisp white effect when illuminating an object containing a fluorescent whitening agent, comprising:
    a light source configured to emit first output light represented by a first color point in a chromaticity diagram, the first color point being on or below a black body line of the chromaticity diagram, and the first output light being white output light having an emission peak in a wavelength range from 400 to 440 nm, the light source comprising:
        at least one first light emitting element adapted to emit normal blue light having an emission peak in a first wavelength range from 440 to 460 nm;
        at least one wavelength converting material arranged to receive light emitted by the first light emitting element, and being capable of emitting light having an emission peak in the green to red wavelength range; and
        at least one second light emitting element adapted to emit deep blue light having an emission peak in a second wavelength range from 400 nm to 440 nm, and providing a spectral contribution to the first output light emitted from the light source in a form of the emission peak in the second wavelength range from 400 to 440 nm without being converted by any wavelength converting material,
    such that when the first output light illuminates the object containing the fluorescent whitening agent which is excitable by the first output light, the object emits crisp white output light represented by a second color point of the chromaticity diagram, wherein the crisp white output light has the emission peak in the wavelength range from 400 to 440 nm, and the second color point is shifted further below the black body line than the first color point.

13. A light emitting module of claim 12, wherein an intensity of the first output light emitted from light emitting module is sufficient to excite the fluorescent whitening agent when a condition of $0.6 \leq A' \leq 3$ is satisfied to provide a desirable crisp white light effect, wherein $A'$ is defined as a ratio of:

$$\frac{\int_{380}^{430} E(\lambda)d\lambda(430-\lambda)}{\int_{380}^{780} E(\lambda)d\lambda} = A',$$

wherein $E(\lambda)$ is a spectral power distribution of the light emitted by the light emitting module and $\lambda$ denotes a wavelength.

* * * * *